United States Patent
Bienkiewicz et al.

(10) Patent No.: US 6,878,405 B2
(45) Date of Patent: *Apr. 12, 2005

(54) METHOD OF TREATING DLC ON SUBSTRATE WITH OXYGEN AND/OR HOT WATER

(75) Inventors: Joseph M. Bienkiewicz, Ann Arbor, MI (US); Jeffrey D. Gordon, Milford, MI (US); Vijayen S. Veerasamy, Ann Arbor, MI (US); Scott V. Thomsen, Milford, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 45 days.

This patent is subject to a terminal disclaimer.

(21) Appl. No.: 10/393,400

(22) Filed: Mar. 21, 2003

(65) Prior Publication Data

US 2004/0067363 A1 Apr. 8, 2004

Related U.S. Application Data

(63) Continuation-in-part of application No. 10/264,317, filed on Oct. 4, 2002.

(51) Int. Cl.[7] .............................................. C23C 16/26
(52) U.S. Cl. .................................... 427/249.7; 427/533
(58) Field of Search ............................. 427/249.7, 533

(56) References Cited

U.S. PATENT DOCUMENTS

| 3,682,528 A | | 8/1972 | Apfel et al. |
| 5,011,745 A | | 4/1991 | Dietrich et al. |
| 5,229,194 A | | 7/1993 | Lingle et al. |
| 6,183,843 B1 | | 2/2001 | Feng et al. |
| 6,303,225 B1 | | 10/2001 | Veerasamy |
| 6,303,226 B2 | | 10/2001 | Veerasamy |
| 6,310,116 B1 | | 10/2001 | Yasuda et al. |
| 6,359,388 B1 | | 3/2002 | Petrmichl |
| 6,368,664 B1 | | 4/2002 | Veerasamy et al. |
| 6,416,816 B2 | | 7/2002 | Veerasamy et al. |
| 6,475,573 B1 | | 11/2002 | Veerasamy et al. |
| 6,660,340 B1 | * | 12/2003 | Kirkpatrick ................. 427/530 |
| 6,665,033 B2 | * | 12/2003 | Callegari et al. ........... 349/123 |
| 6,706,363 B2 | * | 3/2004 | Honda et al. ............... 428/141 |
| 2002/0045037 A1 | | 4/2002 | Boire et al. |
| 2002/0127404 A1 | | 9/2002 | Veerasamy |
| 2003/0118828 A1 | | 6/2003 | Briand et al. |

FOREIGN PATENT DOCUMENTS

WO     WO 02/04375     1/2002

OTHER PUBLICATIONS

"Role of Water and Oxygen in Wet and Dry Oxidation of Diamond", Larsson et al., Jul. 15, 2001, pp. 1026–1034.

* cited by examiner

*Primary Examiner*—Bret Chen
(74) *Attorney, Agent, or Firm*—Nixon & Vanderhye P.C.

(57) ABSTRACT

A method is provided for treating diamond-like carbon (DLC) with a hot liquid and/or ion beam. This treatment can reduce the contact angle of the coating. In certain example embodiments, at least oxygen gas is used in an ion beam source(s) that generates the ion beam(s) used for the ion beam treatment.

41 Claims, 6 Drawing Sheets

METHOD OF TREATING DLC ON SUBSTRATE WITH OXYGEN AND/OR HOT WATER

This application is a continuation-in-part (CIP) of U.S. Ser. No. 10/264,317, filed Oct. 4, 2002, the entire disclosure of which is hereby incorporated herein by reference.

Certain example embodiments of this invention relate to a hydrophilic coating including diamond-like carbon (DLC) provided on (directly or indirectly) a substrate of glass, plastic, or the like, and a method of making the same. More particularly, this invention relates to a DLC inclusive coating that is treated with: (a) an ion beam including oxygen, and/or (b) hot liquid (e.g., hot water in liquid and/or vapor form) in order to cause the DLC inclusive coating to become hydrophilic and/or to reduce its contact angle $\theta$.

BACKGROUND OF THE INVENTION

It is often desirable to provide a hydrophilic coating (e.g., anti-fog coating) on a substrate such as an automotive windshield, automotive window, automotive mirror, architectural mirror, bathroom mirror, architectural window, or the like. Such coatings may reduce the likelihood of water drops deposited on the substrate taking globular shape(s), thereby enabling visibility to be improved. In other words, hydrophilic coatings function to reduce bead-like condensation on substrate surfaces (e.g., on the interior surface of an automotive windshield or window). In essence, a hydrophilic coating can reduce the formation of many tiny droplets of liquid which can scatter light on a surface (i.e., make condensation on a surface film-wise as opposed to droplet-wise).

Unfortunately, certain hydrophilic coatings are not as durable and/or hard as would otherwise be desired and thus are not efficient from a practical point of view for applications such as automotive windshields and/or other types of windows or mirrors.

U.S. patent application Ser. No. 2002/0127404, hereby incorporated herein by reference, discloses a layer comprising diamond-like carbon (DLC) that is treated with ultraviolet (UV) radiation in order to cause it to become hydrophilic (i.e., the UV exposure causes the contact angle $\theta$ of the layer to decrease). While this process of making a hydrophilic DLC inclusive layer works well, it takes much time. The example in Ser. No. 2002/0127404 states that the DLC was treated with QUV for 86 hours in order to cause the contact angle $\theta$ of the DLC to drop from 73.47 degrees to 19.12 degrees (i.e., this contact angle reduction of 74% took 86 hours). It would be desirable if a DLC inclusive layer could be made to be hydrophilic via a less time-consuming process.

In view of the above, it is apparent that there exists a need in the art for (i) a coated article (e.g. coated glass or plastic substrate) having hydrophilic properties, and/or a method of making the same, (ii) a protective hydrophilic coating for window and/or mirror substrates that is somewhat resistant to scratching, damage, and/or (iii) a process for reducing a contact angle of DLC in a less time-consuming manner.

It is a purpose of different embodiments of this invention to fulfill any or all of the above described needs in the art, and/or other needs which will become apparent to the skilled artisan once given the following disclosure.

SUMMARY OF THE INVENTION

An object of this invention is to provide a durable coated article that is less likely to attract or be affected by bead-like liquid condensation. Exemplary applications to which such hydrophilic coating(s) may be applied include, for example without limitation, automotive windshields, automotive backlites (i.e., rear vehicle windows), automotive side windows, architectural windows, mirrors, coated glass used for table furniture, etc.

Another object of certain embodiments of this invention is to treat a layer comprising DLC in order to cause its contact angle $\theta$ to drop/decrease. In certain example embodiments, the layer comprising DLC may be treated with at least one of: (a) an ion beam(s) including oxygen, and (b) a hot liquid and/or vapor such as hot water in order to cause the contact angle of the layer comprising DLC to decrease in a relatively short period of time.

In certain example embodiments, it has surprisingly been found that ion beam treating a DLC inclusive layer (e.g., using oxygen and nitrogen gases, and/or water vapor gas, for example, in the ion source) oxidizes the surface of the DLC inclusive layer thereby causing its contact angle $\theta$ to quickly drop in a short period of time. One or more ion beams may be used in the ion beam treatment.

In other example embodiments, it has surprisingly been found that treating the DLC inclusive layer with a hot liquid and/or vapor (e.g., hot water in liquid and/or vapor form) oxidizes the surface of the DLC inclusive layer thereby causing its contact angle $\theta$ to quickly drop in a short period of time thereby making it more hydrophilic. The hot water treatment may or may not be used in combination with the ion beam treatment with oxygen in different embodiments of this invention.

Another object of this invention is to provide a scratch resistant hydrophilic coating.

Another object of certain example embodiments of this invention is to provide a coated article, wherein a layer of the coating includes both $sp^2$ and $sp^3$ carbon-carbon bonds and has a surface energy $Y_c$ of at least about 20 mN/m, more preferably at least about 24 mN/m, and most preferably at least about 26 mN/m.

Yet another object of this invention is to fulfill one or more of the above listed objects.

Certain example embodiments of the instant invention provide a method of reducing a contact angle $\theta$ of a layer comprising diamond-like carbon (DLC), the method comprising: reducing the contact angle $\theta$ of the layer comprising DLC by at least about 10% by at least one of: (a) treating a surface of the layer comprising DLC with at least oxygen ions from at least one ion source; and (b) treating the surface of the layer comprising DLC with a hot liquid and/or vapor at a temperature of at least 50 degrees C.

Other example embodiments of this invention provide a method of making a coated article, the method comprising: depositing a layer comprising diamond-like carbon (DLC) on a substrate; after said depositing, ion beam treating the layer comprising DLC and thereafter treating the layer comprising DLC with a hot liquid and/or vapor at a temperature of from about 50 to 200 degrees C.; and wherein a combination of said ion beam treating and said treating with a hot liquid and/or vapor causes a contact angle $\theta$ of the layer comprising DLC to decrease by at least about 20%.

Still further example embodiments of this invention provide a method of making a coated article, the method comprising: depositing a layer comprising diamond-like carbon (DLC) on a substrate; and treating the layer comprising DLC with a hot liquid and/or vapor (e.g., which may include hot water in certain example instances) at a temperature of at least about 50 degrees C. to cause a contact angle $\theta$ of the layer comprising DLC to decrease.

This invention will now be described with respect to certain embodiments thereof, along with reference to the accompanying illustrations.

IN THE DRAWINGS

DETAILED DESCRIPTION OF CERTAIN EXAMPLE EMBODIMENTS OF THIS INVENTION

Figure 1:
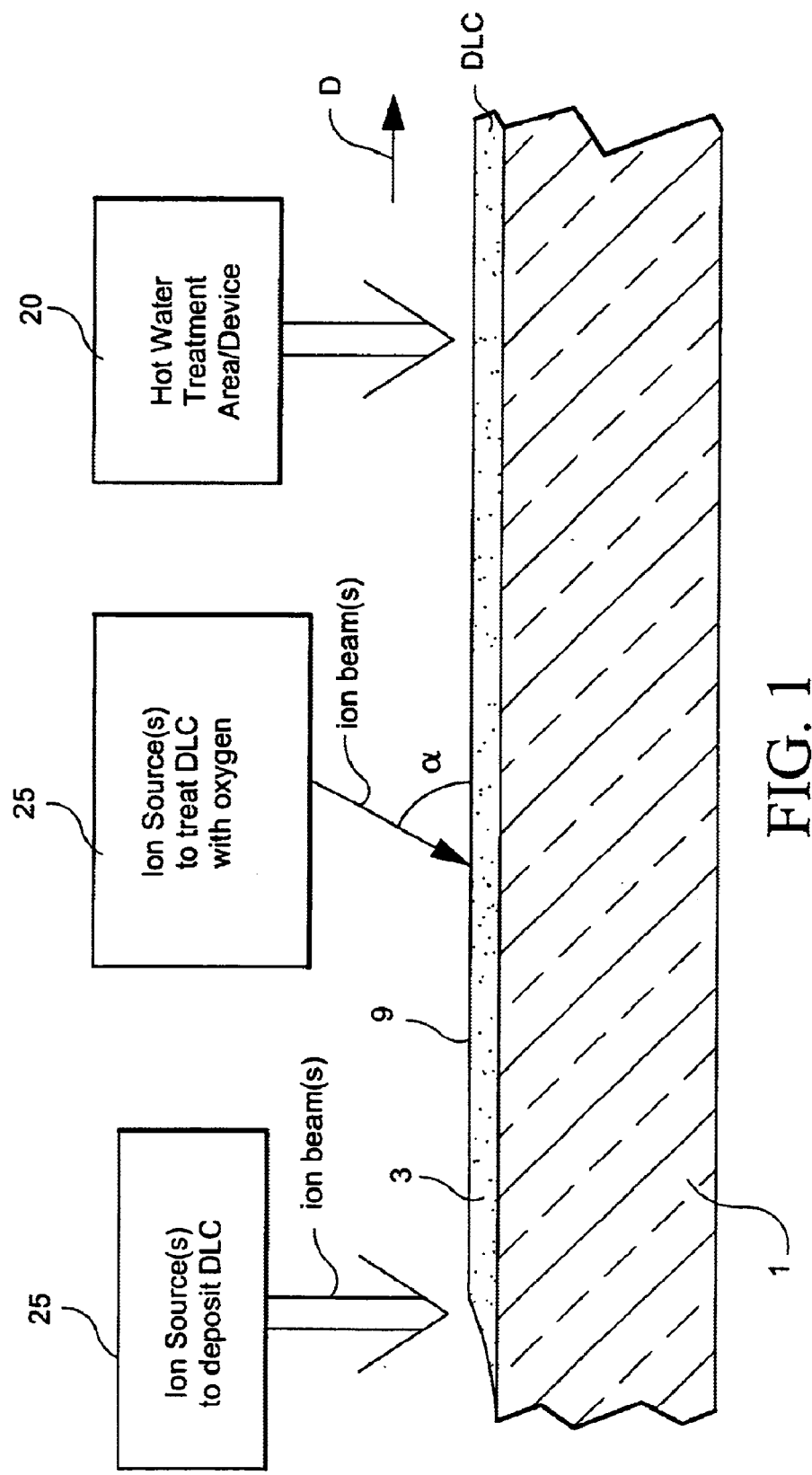
FIG. 1 is a side cross sectional view of a coated article according to an embodiment of this invention, wherein a substrate is provided with at least a layer of or including DLC thereon and is treated with at least one of (a) an ion beam(s), and (b) a hot liquid such as water in liquid and/or vapor form, in order to cause the layer's contact angle θ to decrease.

Referring now more particularly to the accompanying drawings in which like reference numerals indicate like elements throughout the accompanying views.

Certain example embodiments of this invention relate to improving hydrophilic qualities of a coated article (e.g., automotive windshield, automotive backlite, automotive side window, snow-mobile windshield, architectural window, mirror, coated glass for use in furniture, etc.) by providing a diamond-like carbon (DLC) inclusive layer or coating on a substrate in a manner such that the resulting article and/or layer has hydrophilic qualities or characteristics. Certain other embodiments of this invention relate to lowering the contact angle θ of a layer comprising DLC, regardless of whether or not the final contact angle ends up rendering the coated article hydrophilic.

Surprisingly, it has been found that the contact angle θ of a layer of or including DLC can be decreased by (a) ion beam treating the DLC layer after it has been deposited, and/or (b) hot liquid/vapor treating the DLC layer after it has been deposited.

The ion beam(s) used for the ion beam treatment (a) may be diffused, collimated, and/or focused, and one or more ion sources (and thus one or more beams) may be used for the ion beam treatment. In certain embodiments, both diffused and collimated beams may be used. It has been found that the ion beam treatment increases the polar component of the DLC inclusive layer's surface energy, which in turn increases the layer's total surface energy. The higher the surface energy, the more hydrophilic the layer and the lower the contact angle θ. Thus, by increasing the surface energy via the ion beam treatment, the hydrophilicity of DLC can be improved and thus the contact angle θ lowered. In certain example embodiments, it has been found that ion beam treating a DLC inclusive layer (e.g., using oxygen and nitrogen gases, and/or water vapor gas, for example, in the ion source(s)) causes the surface of the DLC inclusive layer to at least partially oxidize thereby causing its contact angle θ to quickly drop in a short period of time (e.g., in seconds or minutes, as opposed to the tens of hours required in U.S. application Ser. No. 2002/0127404).

In certain example embodiments, the ion beam treatment of the DLC inclusive layer with at least oxygen causes the contact angle θ of the DLC inclusive layer to drop (decrease) at least about 5%, more preferably at least about 10%, still more preferably at least about 20%, even more preferably at least about 40%, still more preferably at least about 50%, and sometimes even at least about 60%. The contact angle θ of the DLC inclusive layer before ion beam treatment may or may not be hydrophilic, but after said ion beam treatment and/or said hot liquid/vapor treatment in certain example embodiments the contact angle θ may less than about 65 degrees, sometimes less than about 50 degrees, sometimes less than about 40 degrees, more preferably less than about 25 degrees, more preferably less than about 20 degrees, even more preferably less than about 15 degrees, and sometimes even less than about 10 degrees.

It has also been surprisingly been found that treatment of a DLC inclusive layer with a hot liquid and/or vapor (e.g., hot water in liquid and/or vapor form) also causes the contact angle θ of the DLC inclusive layer to decrease. The hot liquid/vapor treatment may or may not be used in combination with the ion beam treatment with oxygen in different embodiments of this invention.

In certain example embodiments, the hot liquid and/or vapor treatment (e.g., using hot water) may cause the contact angle θ of the DLC inclusive layer to drop (decrease) at least about 5%, more preferably at least about 10%, still more preferably at least about 20%, even more preferably at least about 40%, still more preferably at least about 50%, and sometimes even at least about 60%. The contact angle θ of the DLC inclusive layer before the hot water treatment may or may not be hydrophilic, but after the hot water treatment (which may or may not be used in combination with the ion treatment) in certain example embodiments the contact angle θ may less than about 40 degrees, more preferably less than about 30 degrees, still more preferably less than about 25 degrees, even more preferably less than about 20 degrees, even more preferably less than about 15 degrees, and sometimes even less than about 10 degrees.

Combining the hydrophilicity with the use of an amorphous diamond-like carbon (DLC) layer/coating provided on the base substrate enables the resulting coated article to have a low contact angle θ as well as surface hardness and scratch resistant characteristics sufficient such that the article may be used in automotive, window, and/or other high exposure environments where durability is desired. Optionally, polar inducing dopant(s) (e.g., B, N, P, As, S, Sb, Ga, In, and/or any other polar inducing dopant) may be provided in the DLC (in addition to the ion beam treatment) so as to help the DLC become more polar, which in turn increases surface energy and thus provides for a more hydrophilic coating. In certain optional embodiments, UV treatment may also be used in combination with the ion beam treatment to cause the contact angle θ of the DLC inclusive layer to decrease and/or stay low.

Figure 2:
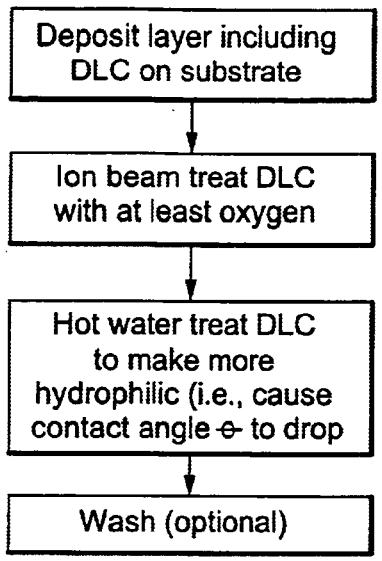
FIG. 2 is a general flowchart according to an example embodiment of this invention, illustrating that ion beam and/or hot liquid treatments may be used to cause the contact angle θ of a DLC inclusive layer to decrease.

FIG. 1 is a side cross-sectional view of a coated article according to an embodiment of this invention, wherein at least one diamond-like carbon (DLC) inclusive protective coating(s) or layer 3 is provided on substrate 1. The coated article has an exterior or outer surface 9. Substrate 1 may be of glass, plastic, ceramic, or the like. Optionally, other layer(s) (e.g., a dielectric layer(s) and/or a multi-layered low-E coating—not shown) may be provided between the DLC inclusive layer 3 and the substrate 1 in certain embodiments of this invention. FIG. 2 is a flowchart illustrating steps taken in order to reduce the contact angle θ of the DLC layer 3 in certain embodiments of this invention.

Referring to FIGS. 1–2, layer 3 comprising DLC may be ion beam deposited on substrate 1 (optionally, other layer(s) may be on the substrate under the DLC layer 3). The term "on" (with regard to a layer being "on" a substrate or other layer) herein means supported by, regardless of whether or not other layer(s) are provided therebetween. Thus, for example, DLC inclusive layer 3 may be provided directly on substrate 1 as shown in FIG. 1, or may be provided on substrate 1 with a low-E coating or other layer(s) therebetween. Exemplary layer systems (in full or any portion of these coatings) that may be used as low-E or other coating(s) on substrate 1 between DLC layer 3 and the substrate are shown and/or described in any of U.S. Pat. Nos. 5,837,108, 5,800,933, 5,770,321, 5,557,462, 5,514,476, 5,425,861, 5,344,718, 5,376,455, 5,298,048, 5,242,560, 5,229,194, 5,188,887, 3,682,528, 5,011,745, WO 02/04375 (U.S. Ser. No. 09/794,224) and 4,960,645, which are all hereby incorporated herein by reference. These optional coatings are provided for purposes of example and are not intended to be limiting.

As deposited, the layer 3 comprising DLC may be deposited as any of the DLC inclusive layer(s) in any of U.S. Pat. Nos. 6,303,226 and/or 6,303,225 (both hereby incorporated herein by reference), or in any other suitable manner/form. Thus, the layer 3 comprising DLC may have more $sp^3$ carbon-carbon bonds than $sp^2$ carbon-carbon bonds either throughout the entire layer and/or in at least one 10 angstrom (Å) thick portion thereof. Moreover, the DLC layer 3 is preferably entirely or at least partially amorphous and may or may not be hydrogenated in certain embodiments. For example, the DLC layer 3 may include from about 1–25% H in certain embodiments, more preferably from about 5–20% H, and most preferably from about 7–18% H in certain embodiments of this invention. In certain embodiments, DLC layer 3 may be from about 10 to 1,000 Angstroms thick, more preferably from about 50 to 250 Angstroms thick. Moreover, in certain exemplary embodiments of this invention, layer 3 has an average hardness of at least about 10 GPa, more preferably of at least about 20 GPa, and even more preferably of at least about 50 GPa. Also, the DLC layer 3 may have an average density of at least about 2.4 grams/cm$^2$ (more preferably from about 2.5 to 3.0 grams/cm$^2$) in certain example embodiments of this invention.

As shown in FIGS. 1–2, the outer surface 9 of the DLC inclusive layer 3 may first be ion beam treated using at least one ion source (and thus at least one ion beam) in order to cause the contact angle θ of the layer 3 to decrease. This ion treatment may take place as the coated substrates moves in direction D under one or more ion source(s), or alternatively while the substrate remains still and the ion source(s) move with respect thereto. When oxygen and nitrogen gas are used in the ion beam source(s) for example, the ion beam treatment of the surface 9 of the coated article causes the outer surface of the layer 3 to at least partially oxidize thereby causing the contact angle to quickly drop (optionally, oxygen with no nitrogen may instead be used as a gas in the ion source which generates the ion beam).

The use of oxygen gas (optionally with N, H, and/or other gas) causes the resulting ion beam(s) that is directed toward surface 9 to include $O_2^-$, $O^-$ and/or $OH^-$ ions (ions including at least oxygen ions). One or more of these ions hit the surface 9 of the DLC inclusive layer 3 and cause its contact angle θ to drop. Presumably, the contact angle drops because C=O—H, C=O, and/or C—O bonds (i.e., oxygen-carbon bonds and/or oxygen-hydrogen-carbon bonds) form at the surface 9 of the DLC inclusive layer 3 thereby causing its surface energy to rise. In other words, the ion beam treatment introduces oxygen to the surface 9 of the DLC inclusive layer 3, which is believed to be a primary reason why the contact angle is caused to quickly drop.

By tuning the gas composition, ion energy, and throw distance in the beam(s), one may be able to run such a treating process at speeds of 100 in./minute or more, and still achieve hydrophilic surface(s). Oxygen is a preferred example gas to be used in a treating ion beam source(s), although other gases may be used instead of or in addition to oxygen in different embodiments of this invention so long as they cause the contact angle to decrease. When N is used in a gas in one or more of the ion beam source(s) for the ion beam treatment (e.g., in combination with oxygen and/or hydrogen gas), the resulting N ions tend to make the surface of DLC layer 3 more electrically conductive than the glass which may be desirable in some instances. In other embodiments, water vapor may be used as a feed gas in at least one of the ion beam treating source(s). Resulting ions can end up being subimplanted in the surface of layer 3, and the polar nature of these ions/molecules when water vapor gas is used can significantly reduce the static potential which can attract dust particles thereby enabling the coating to be more resistant to dust accumulation. In still other embodiments, the ion treatment may use $H_2O_2$ gas in at least one of the ion beam sources used for the treating. Again, the $O_2^-$, $O^-$ and/or $OH^-$ ions hit the surface 9 of the DLC inclusive layer 3 and cause contact angle θ to drop as discussed above. Other gases may also be used in other embodiments of this invention. It is noted that the ion beam treatment, while causing the contact angle of layer 3 to decrease, may cause some portion (e.g., 0–20 angstroms) of the layer 3 to be removed during the ion beam treatment process. Thus, it will be appreciated that various gas(es) may be used in an ion source(s) for generating an ion beam(s) including oxygen for treating the surface of the DLC inclusive layer, with example gases including, but not limited to, $O_2$, $H_2O$, $H_2O_2$, $N_2O$, $CO_2$, and/or the like.

The angle α at which the ion beam(s) hits the surface 9 of DLC inclusive layer 3 during the ion beam treatment may be from about 1–90 degrees in different embodiments of this invention. However, in certain embodiments, the angle α that the beam(s) makes with the surface 9 of the coated article may be from about 30–60 degrees, most preferably from about 40–50 degrees.

In addition to, or instead of, the ion beam treatment of the DLC surface 9 with an ion beam(s) including oxygen, the surface 9 of the DLC inclusive layer 3 may be treated with a hot liquid and/or vapor at treatment area 20 in order to cause its contact angle θ to decrease as shown in FIGS. 1–2. In an example embodiment of this invention, the surface 9 of the DLC layer 3 is exposed to hot water (in liquid and/or vapor form). In certain example embodiments, the hot water may be at a temperature of from 50 to 200 degrees C., more preferably from about 70 to 200 degrees C., even more preferably from about 80 to 150 degrees C. It has been found that temperatures lower than this do not result in the desired contact angle reduction of surface 9 of DLC layer 3.

Figure 9:
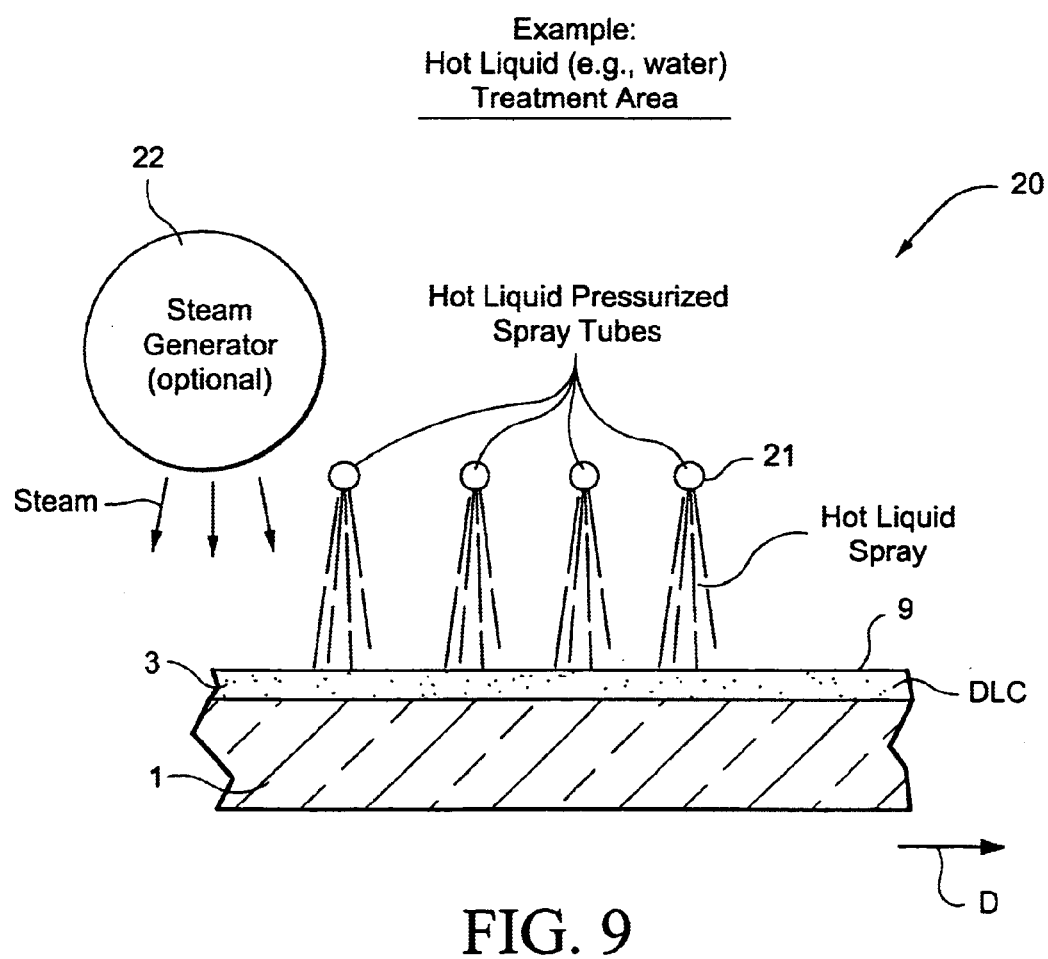
FIG. 9 is a cross sectional schematic diagram illustrating an example of how a coated article is treated with a hot liquid according to an example embodiment of this invention in order to cause its contact angle to decrease.

Referring to FIG. 9, an example embodiment is illustrated as to how the surface 9 of DLC layer 3 is exposed to hot liquid and/or vapor in area 20. Although this invention is not so limited, the liquid and/or vapor used to treat the DLC layer 3 may comprise water in certain example embodiments of this invention. In certain example embodiments, other materials such as HOCl, $H_2O_2$, Windex™, mixtures thereof, and/or the like may be added to the water. These other materials may in some instances accelerate the contact angle reduction process in certain example embodiments of this invention.

As the coated substrate is moving in direction D right after it leaves the ion beam deposition area and ion beam treatment area, it passes under one or more pressurized spray nozzles/tubes 21 which direct hot water under pressure toward the surface 9 of DLC layer 3 as shown in FIG. 9. The functionality of the system in this respect is similar to that of one or more power washers. The hot water impinges upon surface 9. Optionally, a steam generator 22 may be provided in addition to, or instead of, nozzles/tubes 21 in order to introduce hot water vapor into area 20 so that such vapor contacts surface 9 of the DLC layer. Nozzles/tubes 21 and generator 22 may be stationary in certain embodiments of this invention, although they may be dynamic in other embodiments. Surface 9 may be hot water treated for any suitable time period in different embodiments of this invention. However, it has been found that hot water treatment for about 10 seconds to 10 minutes (more preferably from about 1 to 5 minutes) is preferable and achieves excellent results. The combination of the hot water (in liquid and/or vapor form) and air contacting the surface 9 at high temperatures is believed to be responsible for the desired reduction in contact angle.

It has also surprisingly been found that the hot water treatment and/or the ion beam treatment of surface 9 enables scratch resistance (SR) of the layer 3 to improve. In certain example embodiments of this invention, the ion beam treatment and/or hot water treatment of surface 9 cause the SR of the layer 3 to improve by at least about 3%, more preferably by at least about 5%, and sometimes by at least about 10%.

Surprisingly, it has been found that this hot liquid and/or vapor treatment of the DLC layer 3 causes its contact angle θ to drop in a desirable manner. Presumably, the contact angle drops because C=O—H, C=O, and/or C—O bonds (i.e., oxygen-carbon bonds and/or oxygen-hydrogen-carbon bonds) form at the surface 9 of the DLC inclusive layer 3 thereby causing its surface energy to rise. In other words, the hot water treatment apparently introduces oxygen to the surface 9 of the DLC inclusive layer 3, which is believed to be a primary reason why the contact angle is caused to quickly drop.

As discussed above, the ion beam treatment and/or hot water treatment of the surface 9 of DLC inclusive layer 3 may cause bonds in or at the surface of the DLC inclusive layer to become more polar, which in turn causes a higher surface energy and lower contact angle θ. In certain example instances, the ion beam treatment and/or hot water treatment may cause more graphitic or polar $sp^2$ type bonds (e.g., C—C $sp^2$ type bonds, C—N $sp^2$ type bonds, and/or the like) to be formed proximate the surface of layer 3 (note: many $sp^3$ type C—C bonds remain in the layer, with the bulk of the layer not being significantly effected). When more bonds at the surface of layer 3 become polar, this results in water being more attracted to the layer 3. The tetrahedral amorphous $sp^3$ type C—C bonds (ta-C) provide the layer 3 with acceptable hardness and/or scratch resistance characteristics while the $sp^2$ type bonds improve the layer's hydrophilicity and cause contact angle θ to drop. Preferably, a substantial portion of the carbon in layer 3 is in amorphous or disordered form (as opposed to crystalline form for example).

Figure 3:
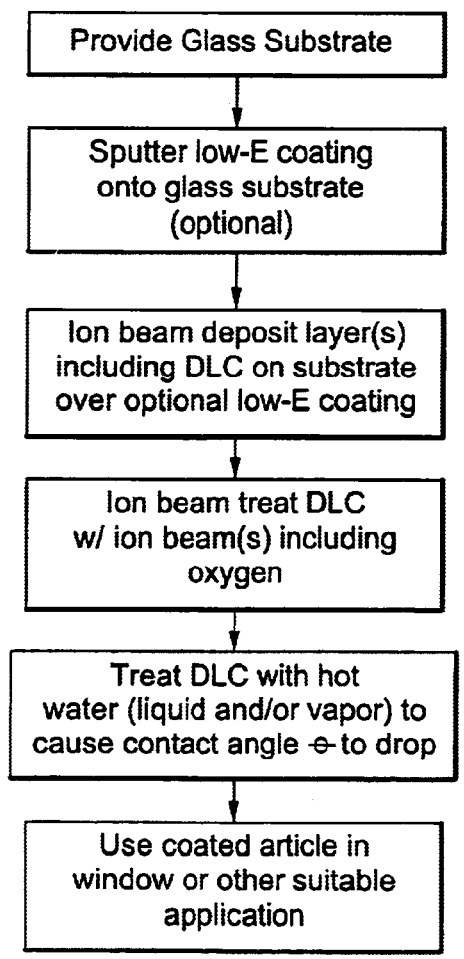
FIG. 3 is a more detailed flowchart according to an example embodiment of this invention, illustrating that ion beam and/or hot liquid treatments may be used for causing the contact angle θ of a DLC inclusive layer to decrease.

FIG. 3 is a flowchart illustrating how a coated article is made according to another example embodiment of this invention. A glass substrate is provided, and an optional low-E coating (e.g., see example low-E coatings discussed above) including at least one infrared (IR) reflective layer (e.g., of or including Ag) sandwiched between at least a pair of dielectric layers is sputtered onto the glass substrate. After sputtering of the low-E coating, a layer comprising DLC 3 is ion beam deposited on the substrate 1 over the low-E coating. The DLC layer 3 is then ion beam treated using at least oxygen ions as discussed above in order to reduce its contact angle θ. After the ion beam treatment, the DLC layer 3 is hot water treated as shown in FIG. 9 so as to cause the contact angle θ of the layer 3 to drop even more. In certain embodiments, the contact angle of the layer 3 may be reduced enough by the ion beam treatment and/or hot water treatment to cause the coated article to be hydrophilic in nature. After washing, the resulting hydrophilic coated article may be used in applications such as vehicle windows, mirrors, architectural windows, IG window units, etc. Moreover, it is noted that UV exposure of the DLC layer 3 after the ion beam treatment and/or hot water treatment may cause the contact angle of the layer to decrease even further, and/or cause it to remain low.

In certain example embodiments (e.g., see FIGS. 1–3), the coated article including the ion beam and/or hot water treated DLC inclusive layer 3 (and optionally other layer(s) such as the low-E coating) on substrate 1 may be at least about 70% transparent to or transmissive of visible light rays, more preferably at least about 75%. When substrate 1 is of glass, the glass may be from about 1.5 to 5.0 mm thick. Conventional soda lime silica glass may be used as substrate 1 in certain embodiments, such glass being commercially available from Guardian Industries, Corp., Auburn Hills, Mich. In certain other embodiments of this invention, substrate 1 may be of borosilicate glass, or of substantially transparent plastic.

Figure 4:
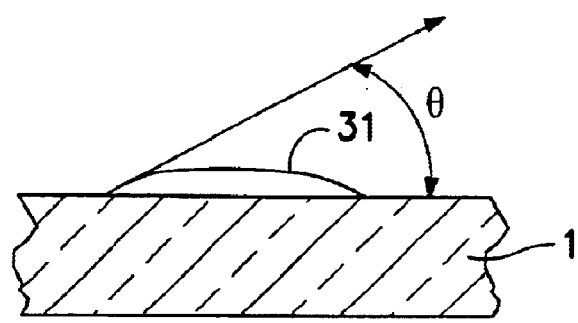
FIG. 4 is a side cross sectional partially schematic view illustrating a contact angle θ of a drop (e.g., sessile drop of water) on an uncoated glass substrate.
Figure 5:
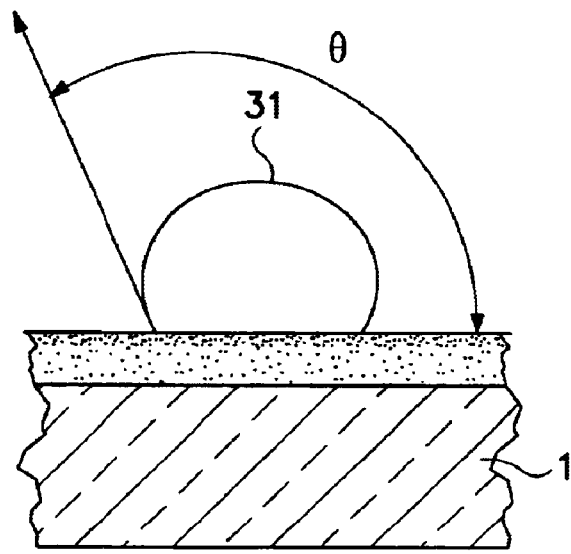
FIG. 5 is a side cross sectional partially schematic view illustrating a high contact angle θ of a drop on a coated article including a hydrophobic coating of, for example, an article disclosed in U.S. patent application Ser. No. 09/442,805.
Figure 6:
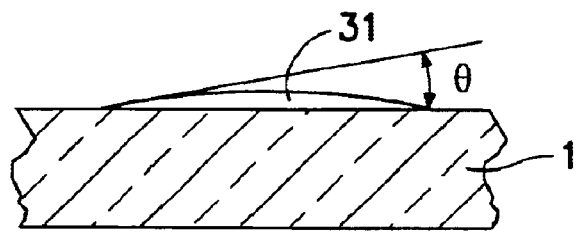
FIG. 6 is a side cross sectional partially schematic view illustrating a low contact angle θ of a drop (e.g., sessile drop of water) on a coated article according to an embodiment of this invention (following ion beam treatment and/or hot liquid treatment for example).

Hydrophilic performance of coating/layer 3 in any of the above embodiments is a function of contact angle θ, surface energy Y, and/or wettability or adhesion energy W. The surface energy Y of layer 3 may be calculated by measuring its contact angle θ. Exemplary contact angles θ are illustrated in FIGS. 4–6. A hydrophilic coating or layer system 3 according to an embodiment of this invention is on the substrate of FIG. 6 (i.e., low contact angle θ), while no coating of any kind is on the substrate of FIG. 4 and a hydrophobic coating (high contact angle) is on the substrate of FIG. 5. No coatings are illustrated in FIGS. 4 and 6 for purposes of simplicity. To measure contact angle θ in an example embodiment, a sessile drop 31 of a liquid such as water is placed on the substrate (which may be coated) as shown in FIGS. 4–6. A contact angle θ between the drop 31 and underlying article appears, defining an angle θ depending upon the interface tension between the three phases at the point of contact. The contact angle θ is greater in FIG. 5 than in FIG. 4, because the coating layer on the substrate in FIG. 5 is hydrophobic (i.e., results in a higher contact angle). However, in certain embodiments of this invention, the contact angle θ in FIG. 6 is low due to the ion beam treatment and/or hot water treatment of the DLC inclusive layer 3 that is on the substrate 1 but it not shown in FIG. 6 for purposes of simplicity.

Generally, the surface energy $Y_c$ of a layer 3 or any other article/layer can be determined by the addition of a polar and a dispersive component, as follows: $Y_c = Y_{CP} + Y_{CD}$, where $Y_{CP}$ is the layer's/coating's polar component and $Y_{CD}$ the layer's/coating's dispersive component. The polar component of the surface energy represents the interactions of the surface mainly based on dipoles, while the dispersive component represents, for example, van der Waals forces, based upon electronic interactions. Generally speaking, the higher the surface energy $Y_c$ of layer 3, the more hydrophilic the layer (and coated article) and the lower the contact angle θ. Adhesion energy (or wettability) W can be understood as an interaction between polar with polar, and dispersive with dispersive forces, between the exterior surface 9 of the coated article and a liquid thereon such as water. For a detailed explanation, see U.S. Pat. No. 2002/0127404 (incorporated herein by reference). In certain example embodiments of this invention, after ion beam treatment and/or hot water treatment of the DLC inclusive layer 3, the surface energy $Y_c$ of layer 3 may be at least about 20 mN/m, more preferably at least about 24 mN/m, and most preferably at least about 26 mN/m.

Figure 7:
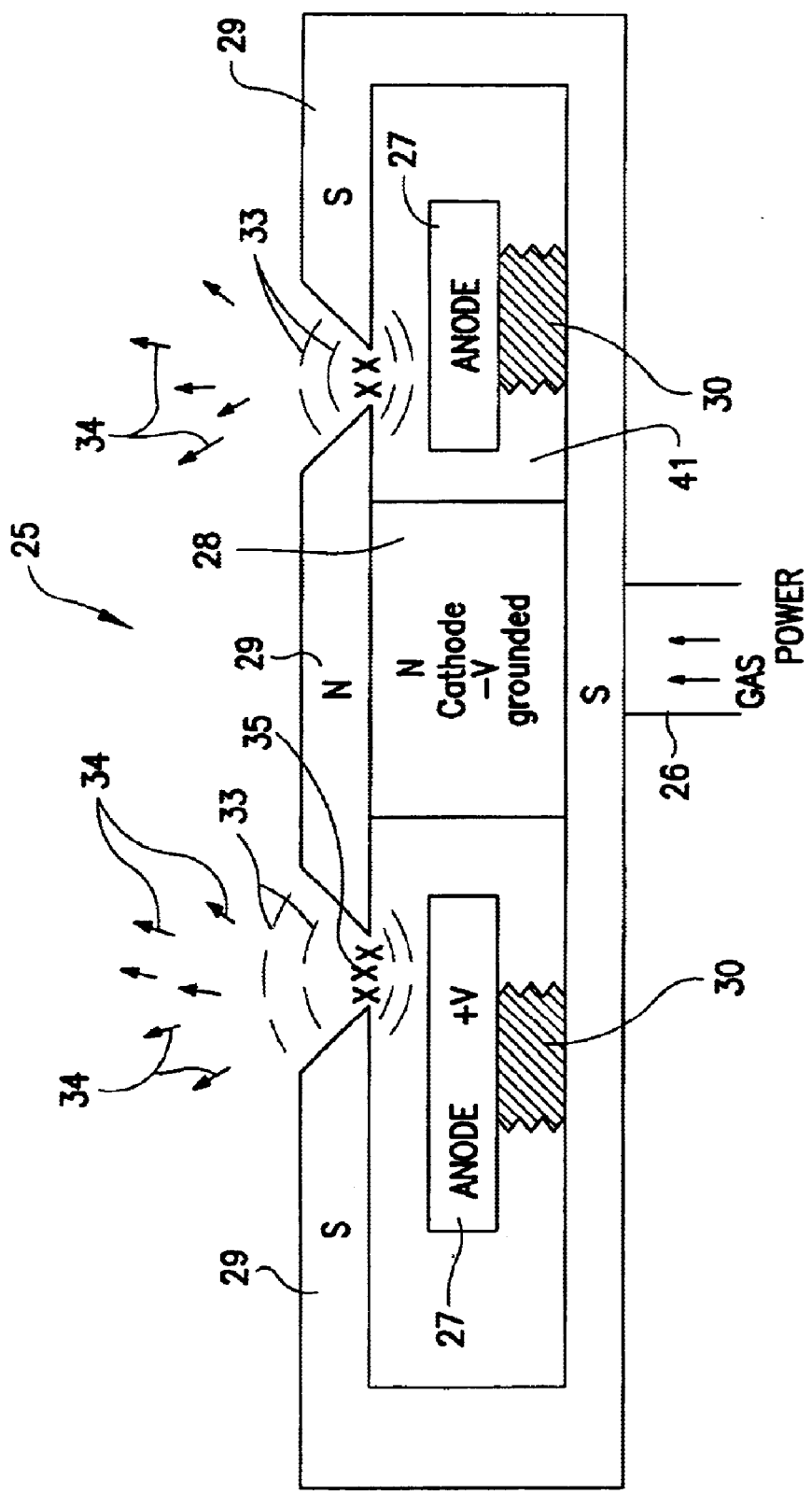
FIG. 7 is a side cross sectional view of an example ion beam source which may be used in any embodiment of this invention for depositing a DLC inclusive layer(s) and/or for ion beam treating a layer of or including DLC in order to cause its contact angle θ to decrease.
Figure 8:
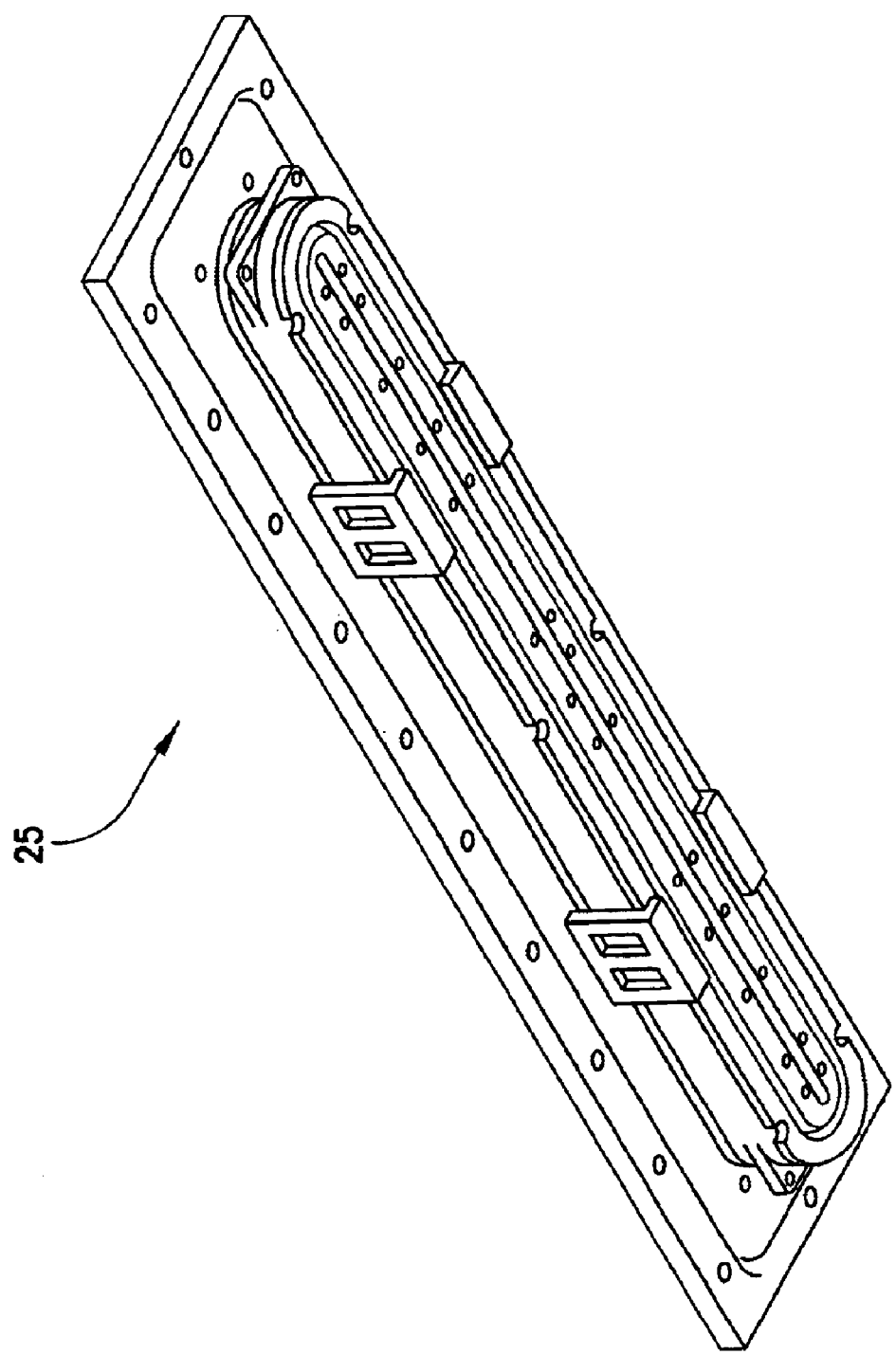
FIG. 8 is a perspective view of the linear ion beam source of FIG. 7.

FIGS. 7–8 illustrate an exemplary linear or direct ion beam source 25 which may be used to deposit layer(s) 3, clean a substrate 1 before depositing layer 3, and/or ion beam treat the surface 9 of DLC inclusive layer 3 with at least oxygen ions to reduce its contact angle θ. Ion beam source (or ion source) 25 includes gas/power inlet 26, racetrack-shaped anode 27, grounded cathode magnet portion 28, magnet poles 29, and insulators 30. An electric gap is defined between the anode 27 and the cathode 29. A 3 kV or any other suitable DC power supply may be used for source 25 in some embodiments. The oxygen and/or other gas(es) discussed herein for use in the ion source during the ion beam treatment, DLC deposition, or the like may be introduced into the source via gas inlet 26, or via any other suitable location. Linear source ion deposition allows for substantially uniform deposition of DLC inclusive layer 3 as to thickness and stoichiometry. Ion beam source 25 is based upon a known gridless ion source design. The linear source may include a linear shell (which is the cathode and grounded) inside of which lies a concentric anode (which is at a positive potential). This geometry of cathode-anode and magnetic field 33 may give rise to a close drift condition.

Feedstock gases (e.g., oxygen inclusive gas as discussed above used in ion beam treating surface 9 to make contact angle drop, or $C_2H_2$ used for DLC deposition) may be fed through the cavity 41 between the anode 27 and cathode 29. The voltage used between the anode 27 and cathode 29 during ion beam treatment of surface 9 with at least oxygen ions is preferably at least 800 V, more preferably at least 1,000 V, and most preferably from about 1,000 to 2,000 V. Moreover, during such ion beam treatment, the oxygen inclusive gas in the source may be provided in terms of a gas flow of from about 100 to 200 sccm in certain example embodiments of this invention, more preferably from about 135 to 180 sccm. The electrical energy between the anode and cathode then cracks the gas to produce a plasma within the source. The ions 34 are expelled out and directed toward the substrate 1 in the form of an ion beam. The ion beam may be diffused, collimated, or focused. Example ions 34 are shown in FIG. 7. A linear source as long as 0.5 to 4 meters may be made and used in certain example instances, although sources of different lengths are anticipated in different embodiments of this invention. Electron layer 35 is shown in FIG. 7 and completes the circuit thereby enabling the ion beam source to function properly. Example but non-limiting ion beam sources that may be used to deposit layer 3 and/or to ion beam treat the same to cause its contact angle to drop are disclosed in U.S. Pat. Nos. 6,303,226, 6,359,388, 6,037,717, and 5,656,891, all of which are hereby incorporated herein by reference.

For purposes of example only, DLC inclusive layer 3 may be ion beam deposited on substrate 1 using source 25 of FIGS. 7–8 in a manner(s) described in any of U.S. Pat. Nos. 6,303,225, 6,303,226, 6,368,664, and/or 6,359,388, all of which are incorporated herein by reference. A hydrocarbon feedstock gas such as $C_2H_2$ may be used in the source in order to ion beam deposit the DLC inclusive layer 3. When it is desired to hydrogenate layer 3, for example, a dopant gas may be produced by bubbling a carrier gas (e.g. $C_2H_2$) through a precursor monomer (e.g. TMS or 3MS) held at about 70 degrees C. (well below the flashing point). Acetylene feedstock gas ($C_2H_2$) is used in certain embodiments to prevent or minimize/reduce polymerization and to obtain an appropriate energy to allow the carbon and/or hydrogen ions to penetrate the article and subimplant therein, thereby causing the layer 3 to grow. Other suitable gases, including polar inducing dopant gases, may also be used in the source to create the ions 34.

After the DLC inclusive layer 3 has been deposited (via ion beam deposition or any other suitable technique), its surface is ion beam treated and/or hot water treated as discussed above in order to decrease its contact angle. It is believed that the ion beam treatment and/or hot water treatment results in oxidation and causes a thin carbon-oxide layer/portion to form at the surface of the layer 3 (e.g., including C=O and/or O—C=O bonds, discussed above for example). This thin at least partially oxidized surface layer portion has a fair amount of attraction to water molecules (polar bonds), thus explaining its hydrophilicity. This thin carbon oxide inclusive layer/portion may be from about 1–30 Å thick, more likely/preferably about 5–15 Å thick. This thin carbon oxide inclusive portion is believed to seal off the remainder of the layer 3 from the ambient atmosphere, so as to prevent further oxidation (i.e., the bulk of the hard $sp^3$ carbon-carbon bonds in the bulk of the layer 3 are thus resistant to oxidation so that the layer maintains its scratch resistance and the like). This sealing off prevents degradation of the bulk of layer 3, while at the same time providing hydrophilic properties (i.e., low contact angle) at the surface thereof.

EXAMPLE

The following hypothetical Example is for purposes of example only, and is not limiting. On a 2 mm thick clear glass substrate, a DLC layer 3 was ion beam deposited to a thickness of 14.69 angstroms (Å) using acetylene ($C_2H_2$) feedstock gas (145 sccm) at a linear velocity of 100 inches/minute, at 2970 V and 0.57 amps. The result was a DLC layer 3 of a-taC:H, having an initial contact angle θ of 73.47 degrees. Then, the coated article was then ion beam treated using oxygen gas in an ion source 25. The ion beam for the oxygen ion treatment hit the surface 9 of layer 3 at an angle α of about 45 degrees. During the ion beam treatment of surface 9 with ions including oxygen ions, the anode/cathode voltage in the source 25 was 1,000 V, the $O_2$ gas flow through the ion source 25 was about 135 sccm, and the line speed was 20 inches/minute. Following the ion beam treatment of surface 9, the coated article including substrate 1 with DLC layer 3 thereon had a contact angle θ which had dropped to about 63 degrees. Thereafter, at area 20, the surface 9 of DLC layer 3 was hot water treated. During the hot water treatment, a plurality of spray nozzles/tubes 21 delivered water under pressure at about 210 degrees F. (about 99 degrees C.) which hit the surface 9 of the layer 3. Following the hot water treatment, the coated article had a contact angle θ of about 20 degrees.

Thus, it can be seen that in the Example the contact angle θ decreased by about 14% due to the ion beam treatment of the DLC (i.e., 73.47−63=10.47; and 10.47/73.47=0.14 or about 14%). Moreover, it can be seen that the contact angle θ decreased by about 68% due to the hot water treatment of the DLC (i.e., 63−20=43; and 43/63=0.68 or about 68%). The overcall combination of the ion beam treatment and the hot water treatment caused the contact angle θ of DLC layer 3 to decrease by about 73% (i.e., 73.47−20=53.47; and 53.47/73.47=0.73 or about 73%). Thus, in this particular example the DLC layer 3 as deposited was not hydrophilic, but after the ion beam treatment and hot water treatment, the contact angle θ of the article had dropped down into the hydrophilic range (i.e., no greater than about 20 degrees).

Once given the above disclosure, many other features, modifications, and improvements will become apparent to the skilled artisan. Such other features, modifications, and improvements are, therefore, considered to be a part of this invention, the scope of which is to be determined by the following claims.

What is claimed is:

1. A method of making a coated article, the method comprising:
   depositing a layer comprising diamond-like carbon (DLC) on a substrate; after said depositing, ion beam treating the layer comprising DLC and thereafter treating the layer comprising DLC with a hot liquid and/or vapor at a temperature of from about 50 to 200 degrees C.; and
   wherein a combination of said ion beam treating and said treating with a hot liquid and/or vapor causes a contact angle θ of the layer comprising DLC to decrease by at least about 20%.

2. The method of claim 1, wherein the combination of said ion beam treating and said treating with a hot liquid and/or vapor causes the contact angle θ of the layer comprising DLC to decrease by at least about 40%, and wherein the layer comprising DLC has an average hardness of at least 10 GPa.

3. The method of claim 1, wherein the combination of said ion beam treating and said treating with a hot liquid and/or vapor causes the contact angle θ of the layer comprising DLC to decrease by at least about 50%.

4. The method of claim 1, wherein the combination of said ion beam treating and said treating with a hot liquid and/or vapor causes the contact angle θ of the layer comprising DLC to decrease by at least about 60%.

5. The method of claim 1, wherein after said ion beam treating and said treating with a hot liquid and/or vapor, the layer comprising DLC has a contact angle θ of less than or equal to 25 degrees.

6. The method of claim 1, wherein after said ion beam treating and said treating with a hot liquid and/or vapor, the layer comprising DLC has a contact angle θ of less than or equal to 20 degrees.

7. The method of claim 1, wherein after said ion beam treating and said treating with a hot liquid and/or vapor, the layer comprising DLC has a contact angle θ of less than or equal to 15 degrees.

8. The method of claim 1, wherein the layer comprising DLC has an average hardness of at least 10 GPa.

9. The method of claim 1, wherein the layer comprising DLC is amorphous.

10. The method of claim 1, wherein the layer comprising DLC is hydrogenated.

11. The method of claim 1, wherein the layer comprising DLC has more $sp^3$ carbon-carbon bonds than $sp^2$ carbon-carbon bonds, and has an average density of at least about 2.4 grams/$cm^2$.

12. The method of claim 1, wherein said ion beam treating comprises using at least one ion beam source that generates at least one ion beam toward a surface of the layer comprising DLC, and wherein at least oxygen gas is present in the ion beam source during the ion beam treating so that at least oxygen ions are directed toward the surface of the layer comprising DLC during said ion beam treating.

13. The method of claim 1, further comprising sputtering a low-E coating onto the substrate before depositing the layer comprising DLC, so that the low-E coating is located between the layer comprising DLC and the substrate, and wherein the substrate is a glass substrate.

14. The method of claim 1, wherein the hot liquid and/or vapor is at a temperature of from about 70 to 200 degrees C.

15. The method of claim 1, wherein the hot liquid and/or vapor is at a temperature of from about 80 to 150 degrees C.

16. The method of claim 1, wherein the hot liquid and/or vapor comprises hot water and is at a temperature of at least about 70 degrees C.

17. The method of claim 1, wherein the hot liquid and/or vapor comprises hot water ($H_2O$).

18. A method of making a coated article, the method comprising:
   depositing a layer comprising diamond-like carbon (DLC) on a substrate;
   providing a gas comprising oxygen in at least one ion source; and
   ion beam treating the layer comprising DLC using at least the one ion source with the gas therein so as to introduce oxygen into an outer surface area of the layer comprising DLC, and wherein sufficient oxygen is introduced into the surface area so as to cause a contact angle θ of the layer comprising DLC to decrease by at least about 5%.

19. The method of claim 18, wherein said ion beam treating causes the contact angle θ of the layer comprising DLC to decrease by at least about 10%, and wherein the layer comprising DLC has an average hardness of at least 10 GPa.

20. The method of claim 18, wherein said ion beam treating causes the contact angle θ of the layer comprising DLC to decrease by at least about 20%.

21. The method of claim 18, further comprising treating the layer comprising DLC with a liquid and/or vapor comprising $H_2O$ at a temperature of at least about 50 degrees C. to cause the contact angle of the layer comprising DLC to decrease.

22. The method of claim 18, further comprising treating the layer comprising DLC with a liquid and/or vapor comprising $H_2O$ at a temperature of at least about 50 degrees C. to cause the contact angle of the layer comprising DLC to decrease.

23. A method of making a coated article, the method comprising:

depositing a layer comprising diamond-like carbon (DLC) on a substrate; and treating the layer comprising DLC with a hot liquid and/or vapor at a temperature of at least about 50 degrees C. to cause a contact angle θ of the layer comprising DLC to decrease.

24. The method of claim 23, wherein the hot liquid and/or vapor is at a temperature of at least about 70 degrees C.

25. The method of claim 23, wherein the hot liquid and/or vapor is at a temperature of from about 70 to 200 degrees C.

26. The method of claim 23, wherein the hot liquid and/or vapor is at a temperature of from about 80 to 150 degrees C.

27. The method of claim 23, wherein said treating of the layer comprising DLC with a hot liquid and/or vapor causes the contact angle θ of the layer comprising DLC to decrease by at least about 5%.

28. The method of claim 23, wherein said treating of the layer comprising DLC with a hot liquid and/or vapor causes the contact angle θ of the layer comprising DLC to decrease by at least about 10%.

29. The method of claim 23, wherein said treating of the layer comprising DLC with a hot liquid and/or vapor causes the contact angle θ of the layer comprising DLC to decrease by at least about 20%.

30. The method of claim 23, wherein said treating of the layer comprising DLC with a hot liquid and/or vapor causes the contact angle θ of the layer comprising DLC to decrease by at least about 40%.

31. The method of claim 23, wherein the liquid and/or vapor comprises $H_2O$.

32. The method of claim 31, wherein the liquid and/or vapor further comprises at least one of $H_2O_2$ and HOCl.

33. The method of claim 23, wherein the liquid and/or vapor comprises at least one of $H_2O$, $H_2O_2$ and HOCl.

34. The method of claim 23, further comprising ion beam treating the layer comprising DLC with at least oxygen ions before and/or after said treating with the liquid and/or vapor.

35. The method of claim 23, wherein the contact angle of the layer comprising DLC is less than or equal to 25 degrees after said treating.

36. The method of claim 23, wherein the contact angle of the layer comprising DLC is less than or equal to 20 degrees after said treating.

37. The method of claim 23, wherein said layer comprising DLC further includes hydrogen.

38. A method of reducing a contact angle θ of a layer comprising diamond-like carbon (DLC), the method comprising:

reducing the contact angle θ of the layer comprising DLC by at least about 10% by at least one of: (a) treating a surface of the layer comprising DLC with at least oxygen ions from at least one ion source; and (b) treating the surface of the layer comprising DLC with a hot liquid and/or vapor at a temperature of at least 50 degrees C.

39. The method of claim 38, wherein the contact angle of the layer comprising DLC is reduced by at least about 20% by at least one of (a) and (b).

40. The method of claim 38, wherein the contact angle of the layer comprising DLC is reduced by at least about 40% by at least one of (a) and (b).

41. The method of claim 38, wherein the liquid and/or vapor comprises water, and is at a temperature of at least about 70 degrees C.

* * * * *